US007893455B2

(12) United States Patent
Ogihara et al.

(10) Patent No.: US 7,893,455 B2
(45) Date of Patent: Feb. 22, 2011

(54) SEMICONDUCTOR LIGHT EMITTING DEVICE WITH STRESS ABSORBER, LED PRINTHEAD, AND IMAGE FORMING APPARATUS

(75) Inventors: Mitsuhiko Ogihara, Tokyo (JP); Hiroyuki Fujiwara, Tokyo (JP); Masataka Muto, Tokyo (JP); Tomoki Igari, Tokyo (JP); Hiroshi Kurokawa, Tokyo (JP)

(73) Assignee: Oki Data Corporation, Tokyo (JP)

( * ) Notice: Subject to any disclaimer, the term of this patent is extended or adjusted under 35 U.S.C. 154(b) by 806 days.

(21) Appl. No.: 11/738,557

(22) Filed: Apr. 23, 2007

(65) Prior Publication Data

US 2007/0262331 A1 Nov. 15, 2007

(30) Foreign Application Priority Data

Apr. 24, 2006 (JP) ............................ 2006-119517

(51) Int. Cl.
*H01L 29/24* (2006.01)
*H01L 23/48* (2006.01)

(52) U.S. Cl. ......................... 257/104; 257/46; 257/107; 257/665; 257/739; 257/740; 257/745; 257/753; 257/756; 257/760

(58) Field of Classification Search .................. 257/46, 257/104, 107, 665, 739, 740, 745, 753, 756, 257/760
See application file for complete search history.

(56) References Cited

U.S. PATENT DOCUMENTS

| | | | | |
|---|---|---|---|---|
| 5,373,173 | A * | 12/1994 | Ohata et al. | 257/88 |
| 6,358,316 | B1 * | 3/2002 | Kizuki et al. | 117/105 |
| 6,392,254 | B1 * | 5/2002 | Liu et al. | 257/59 |

FOREIGN PATENT DOCUMENTS

| | | |
|---|---|---|
| JP | 08-22983 | 1/1996 |
| JP | 2004-179641 | 6/2004 |
| JP | 2005-86134 | 3/2005 |
| JP | 2007-27512 | 2/2007 |
| JP | 2007-123476 | 5/2007 |

* cited by examiner

*Primary Examiner*—Thanh V Pham
(74) *Attorney, Agent, or Firm*—Rabin & Berdo, PC

(57) ABSTRACT

An inclined surface having an inclination angle θ is formed in an edge portion which forms an opening portion of an interlayer insulating film, thereby reducing a stress by the inclined surface.

18 Claims, 15 Drawing Sheets

30
20
11
10
103
107
θ
32
31
12
30
θ
102
104
105
106

20
11
10
107
103
16
12
31
32
30
13
102
14
104
105
106
100

10
11
12
13
14
15
16
17
18
100

σtot
12
16
31A
30
103(100)
10

16
σm
31
32
30
θ
10

103(100)
12
32
30

100
104
105
106
102
34
30
34a
31
12
103
107
34
30
20
11
10

30
20
11
10
35
34
31
34a
30
34
102
104
105
106
103
107
100

14
102
13
30
36
36a
31
16
30
20
11
10
104
105
106
103
107

202
202a
202b
202c
202d
202e 300
301
302
303
304
318
309
311
310
308
307
306
305
312
301a
302a
320
303a
303d
303c
303b
303e
304a
313
314
316
317
315
Y
M
C
K

SEMICONDUCTOR LIGHT EMITTING DEVICE WITH STRESS ABSORBER, LED PRINTHEAD, AND IMAGE FORMING APPARATUS

BACKGROUND OF THE INVENTION

1. Field of the Invention

The invention relates to a semiconductor device which is used as an LED (Light Emitting Diode) array or the like, an LED printhead including the semiconductor device, and an image forming apparatus.

2. Description of the Related Art

In an image forming apparatus of an electrophotographic system, an LED printhead obtained by combining an LED array chip in which a number of LEDs are arranged and a driver chip provided with a driving circuit is used.

In such a kind of image forming apparatus, since high resolution is required, an LED printhead obtained by mounting a plurality of LED array chips and a plurality of driver chips onto a supporting board or a printed circuit board is used.

To reduce the number of chips to be mounted, there has been proposed a semiconductor device having such a structure that a semiconductor thin film on which LED elements have previously been provided is fixed onto a semiconductor substrate on which a driving circuit has been formed and each of the LED elements and the driving circuit are electrically connected by a wiring pattern (refer to JP-A-2004-179641).

In such a semiconductor device, in order to provide wirings, an inter-layer insulating film made of a material of SiN or the like is provided on the semiconductor thin film. However, in this case, since it is necessary to provide a contact electrode for electrically connecting a contact layer of the semiconductor thin film and the wirings, an opening portion for exposing the contact layer has been formed in the inter-layer insulating film.

However, as for the opening portion provided in the inter-layer insulating film, since its edge portion is formed from the orthogonally-crossing surface which rises in the thickness direction, stresses which are applied from the contact electrode and the inter-layer insulating film are concentrated near the opening portion and there is a risk that a crack occurs in the semiconductor thin film or the contact electrode formed in the opening portion is peeled off from the edge portion of the opening portion.

SUMMARY OF THE INVENTION

It is an object of the invention to provide a semiconductor device of a structure in which no cracks occur in a semiconductor thin film and a peel-off of a contact electrode can be prevented, an LED printhead using the semiconductor device, and an image forming apparatus.

According to the present invention, there is provided a semiconductor device comprising:

a semiconductor thin film on which semiconductor elements are provided and which is fixed onto a substrate;

an inter-layer insulating film which is provided on the semiconductor thin film; and an opening portion which is formed in the inter-layer insulating film at a position where a contact electrode that is electrically connected to the semiconductor elements is provided, wherein a stress absorbing portion which absorbs a stress that is applied from the substrate is provided along an edge portion of the opening portion.

Moreover, in the semiconductor device, each corner portion of the stress absorbing portion may be formed in an arc shape.

Moreover, in the semiconductor device, the inter-layer insulating film may be made of one of or a combination of $SiO_2$, SiN, and SiON.

Moreover, in the semiconductor device, the stress absorbing portion may be formed by an inclined surface provided for the edge portion which forms the opening portion of the semiconductor thin film.

Moreover, in the semiconductor device, the stress absorbing portion may be formed by a thin extending portion which is a part of a thin insulating film formed on the inter-layer insulating film so as to have a thickness smaller than that of the inter-layer insulating film and which covers the edge portion of the opening portion and extends to the inside of the edge portion.

Moreover, in the semiconductor device, the stress absorbing portion may be formed by a coating film which covers at least the edge portion of the opening portion of the inter-layer insulating film and extends to the inside of the edge portion. Then the coating film may be composed of organic materials.

Moreover, in the semiconductor device, the semiconductor thin film may be composed of single crystal semiconductor.

Further, according to the present invention, there is provided an LED printhead, comprising:

a semiconductor device;

a supporting body which supports the semiconductor device; and a lens array which converges light emitted from each of the LEDs, wherein the semiconductor device includes:

a semiconductor thin film on which semiconductor elements are provided and which is fixed onto a substrate;

an inter-layer insulating film which is provided on the semiconductor thin film; and an opening portion which is formed in the inter-layer insulating film at a position where a contact electrode that is electrically connected to the semiconductor elements is provided, wherein a stress absorbing portion which absorbs a stress that is applied from the substrate is provided along an edge portion of the opening portion, and wherein the plurality of semiconductor elements are made by LEDs (Light Emitting Diodes).

Furthermore, according to the present invention, there is provided an image forming apparatus, comprising:

a LED printhead;

a photosensitive body which is exposed by the light emitted from the LED printhead and on which an electrostatic latent image is formed; and a developing unit which develops the electrostatic latent image, wherein the LED printhead includes:

a semiconductor device;

a supporting body which supports the semiconductor device; and a lens array which converges light emitted from each of the LEDs, wherein the semiconductor device has:

a semiconductor thin film on which semiconductor elements are provided and which is fixed onto a substrate;

an inter-layer insulating film which is provided on the semiconductor thin film; and an opening portion which is formed in the inter-layer insulating film at a position where a contact electrode that is electrically connected to the semiconductor elements is provided, wherein a stress absorbing portion which absorbs a stress that is applied from the substrate is provided along an edge portion of the opening portion, and wherein the plurality of semiconductor elements are made by LEDs (Light Emitting Diodes).

According to the invention, since the stress absorbing portion is provided in the edge portion of the opening portion of the inter-layer insulating film, it is possible to prevent the stresses from the substrate side from being concentrated on the opening portion. Thus, it is possible to prevent the crack from occurring in the semiconductor thin film and to prevent the contact electrode from being peeled off from the edge portion of the opening portion.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Embodiments of the invention will be described in detail hereinbelow with reference to the drawings.

Embodiment 1

Figure 3:
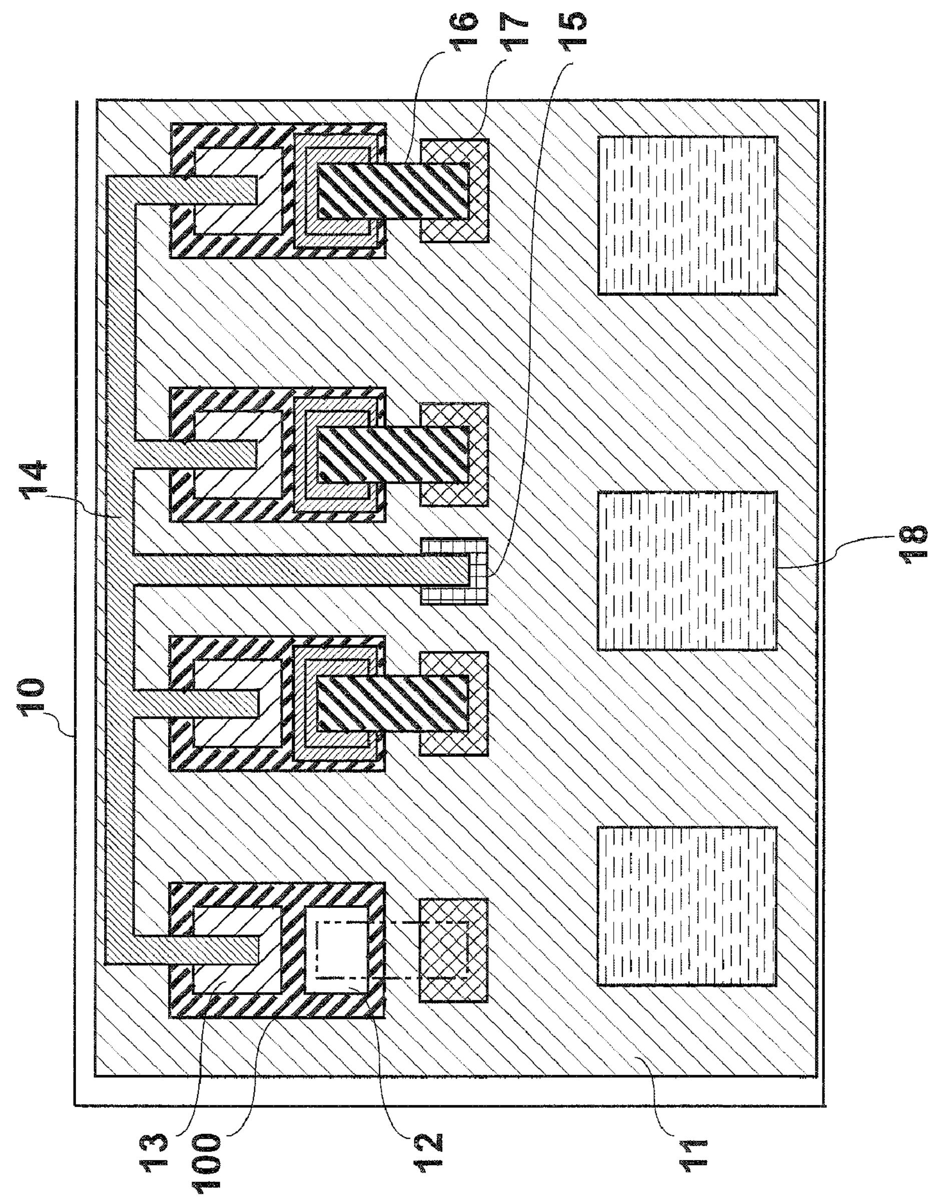
FIG. 3 is a plan view of the semiconductor device according to the embodiment 1 of the invention.
Figure 4:
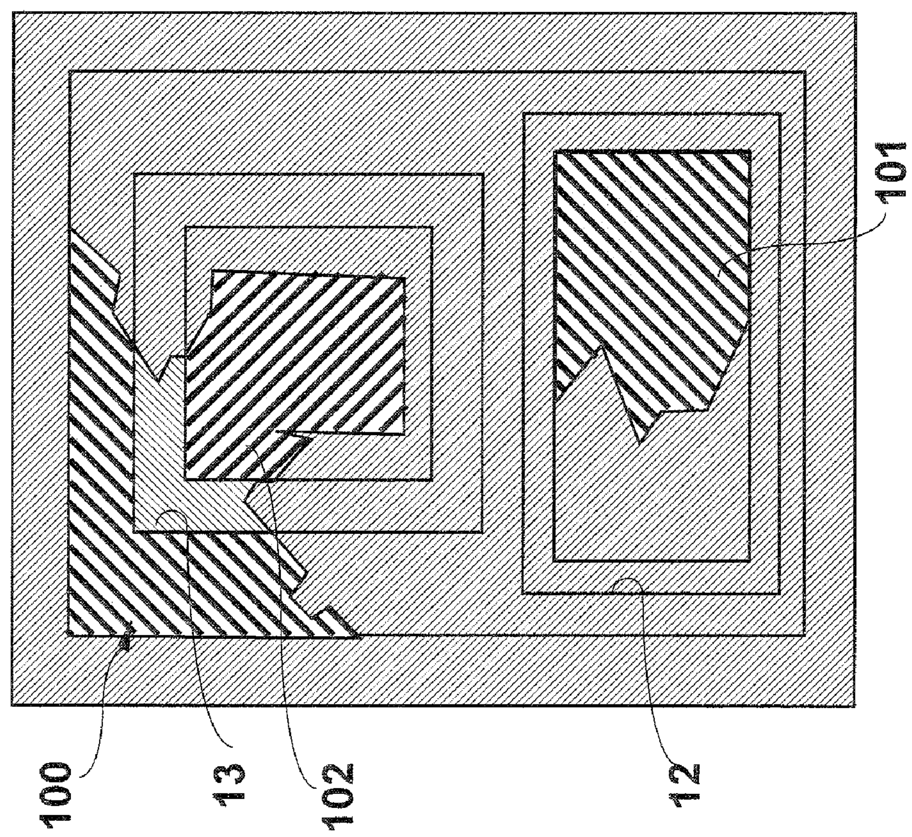
FIG. 4 is an enlarged plan view showing the main portion of the semiconductor device of FIG. 3 with a part cut away.

FIG. 3 is a plan view of a semiconductor device according to the invention. FIG. 4 is a plan view of a main portion of the semiconductor device.

The semiconductor device of the invention has a silicon substrate 10. A driving circuit (not shown) made by, for example, an Si-CMOS is provided in an IC region 11 of the substrate 10. A plurality of semiconductor thin films (epitaxial films) 100 are fixed onto the substrate 10. The semiconductor thin film 100 is covered by an inter-layer insulating film, which will be explained hereinafter. An opening portion of a first conductive type side contact, that is, an opening portion 12 of an n-type side contact and an opening portion of a second conductive type side contact, that is, an opening portion 13 of a p-type side contact are formed in the inter-layer insulating film, respectively. One end of a p-type side wiring 14 is connected to the p-type side contact (layer) through the opening portion 13. The other end of the wiring 14 is connected to a connecting electrode 15 for electrically connecting to the driving circuit side. One end of an n-type side wiring 16 is connected to the n-type side contact (layer) through a contact electrode (not shown). The other end of the wiring 16 is connected to a connecting electrode 17 for electrically connecting to the driving circuit side. Wire-bonding use pads 18 for inputting signal to the driving circuit from the outside and for supplying electrode are provided on the IC region 11.

As shown in FIG. 4, the opening portions 12 and 13 of the inter-layer insulating film are provided on the semiconductor thin film 100, so that contact layers 101 and 102 as top layers of the semiconductor thin film 100 are exposed.

Figure 1:
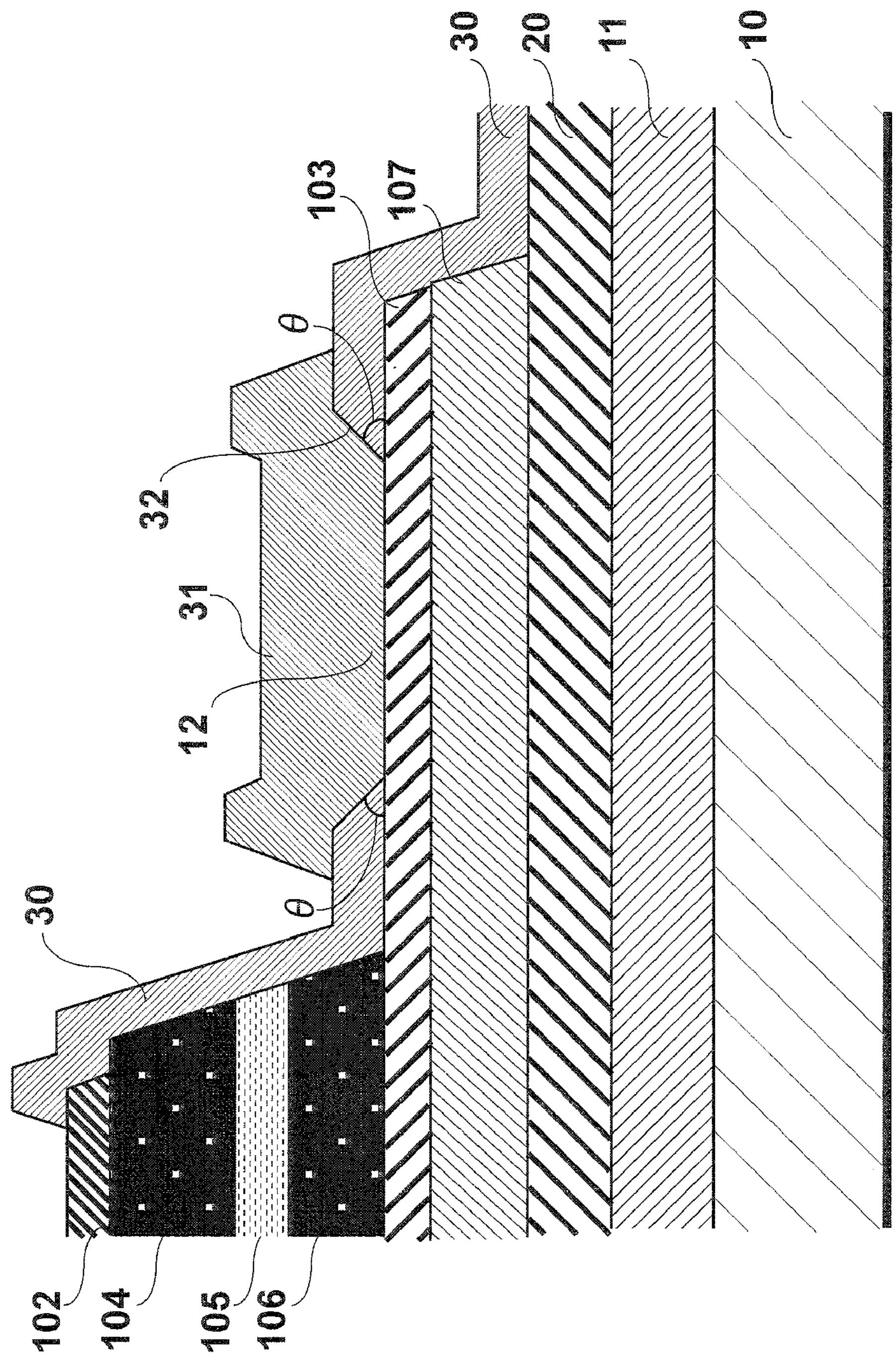
FIG. 1 is a cross sectional view schematically showing a main portion of a semiconductor device according to an embodiment 1 of the invention.
Figure 2:
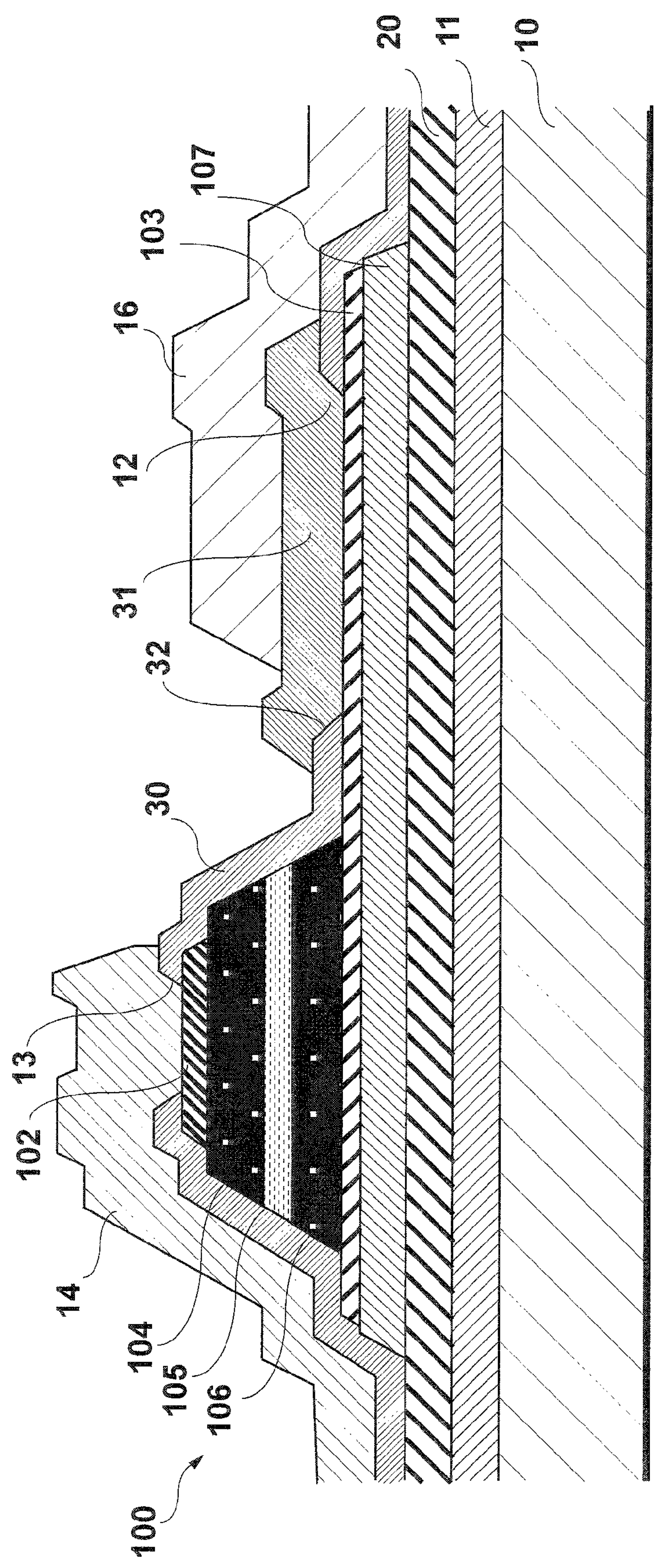
FIG. 2 is a cross sectional view schematically showing the semiconductor device according to the embodiment 1 of the invention.

FIG. 2 is a cross sectional view of the semiconductor device according to the invention. FIG. 1 is an enlarged cross sectional view of the main portion of the semiconductor device.

In those diagrams, reference numeral 10 denotes the silicon substrate. The IC region 11 provided with the driving circuit is formed in an upper portion of the substrate 10. A flat layer 20 is formed on the IC region 11. The semiconductor thin film 100 is fixed onto the flat layer 20.

The semiconductor thin film 100 has an LED semiconductor element. As shown in FIGS. 1 and 2, the semiconductor thin film 100 for forming the LED composed of single crystal semiconductor is formed of the top p-type GaAs contact layer 102, a p-type AlxGal-xAs clad layer 104, an n-type AlyGal-yAs active layer 105, an n-type AlzGal-zAs clad layer 106, an n-type GaAs contact layer 103, and an n-type conductive layer 107. The conductive layer 107 is directly fixed onto the flat layer 20 on the substrate 10. Other than GaAs and AlGaAs, single crystal semiconductors of GaN, AlGaN, InGaN, AlN, AlGaInP, AlGaAsP, AlInN, InP, Si, SiGe can be used for the semiconductor thin film. Amorphous semiconductors and polycrystal semiconductors, such as amorphous Si and polycrystal Si can be also applied in the semiconductor thin film.

The semiconductor thin film 100 is covered by an inter-layer insulating film 30 made of the material of SiN. The foregoing opening portions 12 and 13 for exposing the contact layers 102 and 103 are formed in the inter-layer insulating film 30. The p-type side wiring 14 is connected to the p-type contact layer 102 through the opening portion 13. The n-type side wiring 16 is connected to the n-type contact layer 103 through a contact electrode 31 formed in the opening portion 12. Therefore, when drive current is supplied to LED (the semiconductor thin film 100) from the driving circuit (not shown) through the wirings 14 and 16, the active layer 105 is made operative and emits light.

A whole thickness of the semiconductor thin film 100 can be set to a value, for example, within a range from 0.1 μm to 10 μm. In the embodiment, as a thickness range adapted to enable a mesa etching structure to be more preferably and easily formed and to enable a wiring pattern of a mesa oblique surface to be more preferably and easily coated, the whole thickness of the semiconductor thin film 100 is set to 1 to 3 μm.

A thickness of semiconductor layer (103, 107) in the n-type side contact forming region can be set to a value within a range from 0.01 μm to 5 μm. In the embodiment, as a thickness range adapted to enable the mesa etching structure to be more preferably and easily formed and to enable the wiring pattern of the mesa oblique surface to be more preferably and easily coated, the thickness of the semiconductor layer (103, 107) in the n-type side contact forming region is set to 0.1 to 1 μm.

The contact electrode 31 is made of AuGe/Ni/Au and is extended to a region on the edge portions of the opening portions of the inter-layer insulating film 30, thereby covering them. When the contact layer 103 is p-type GaAs, the contact electrode will be made of Al or Ni/Al or Ti/Pt/Au.

In the embodiment, as shown in FIG. 1, an inclined surface 32 having an angle of θ for a flat surface of the contact layer 103 has been formed as a stress absorbing portion in the edge portion forming the opening portion 12 of the inter-layer insulating film 30. Therefore, when stresses are applied from the contact electrode 31 and the inter-layer insulating film 30, the concentration of the stresses on the edge portion forming the opening portion 12 is reduced by the inclined surface 32. Thus, it is possible to prevent a crack from occurring in the semiconductor thin film 100 and to prevent the contact electrode 31 from being peeled off from the edge portion.

Figure 5:
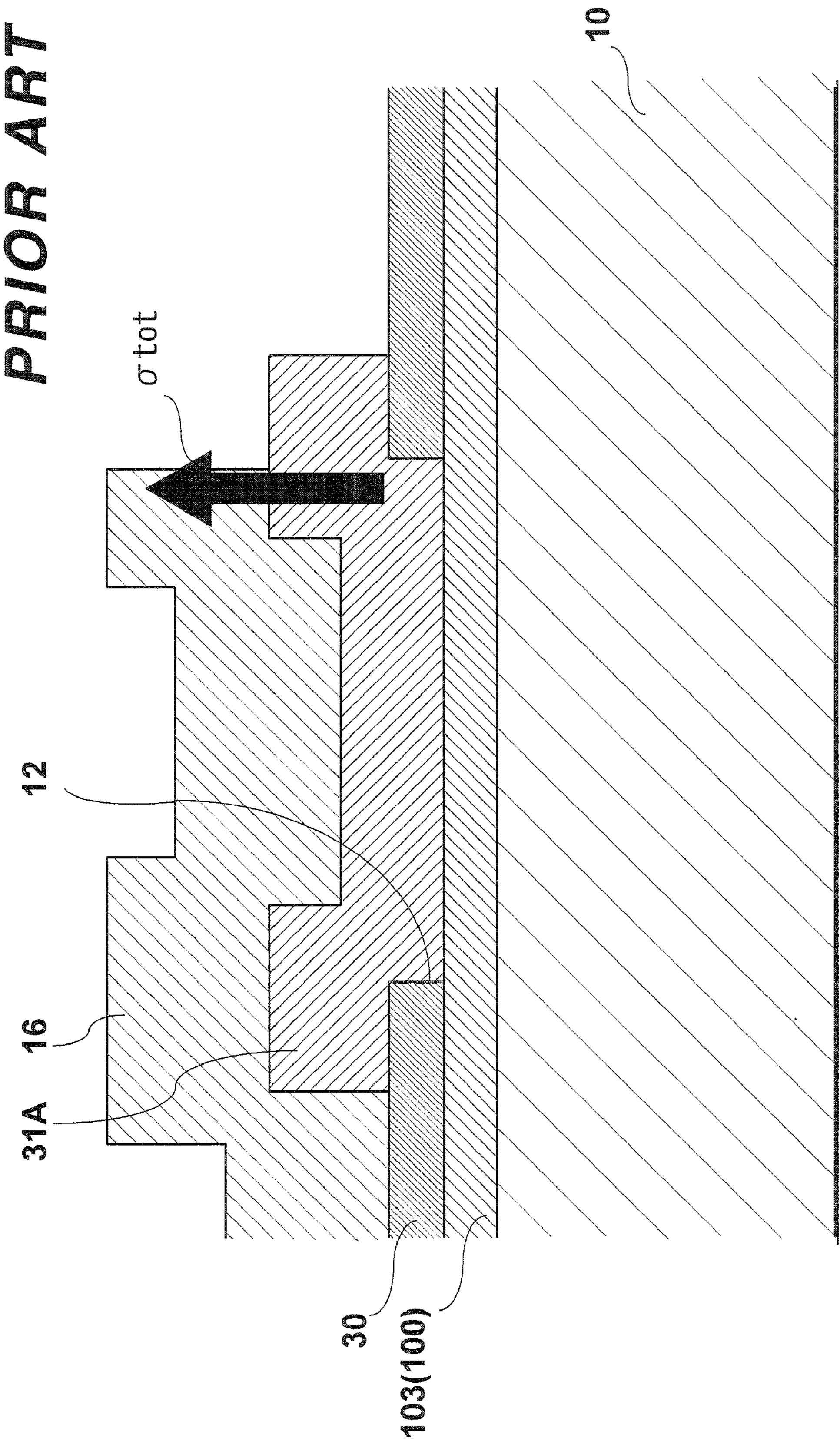
FIG. 5 is a schematic cross sectional view for explaining stresses which are applied to a conventional semiconductor device.

The stresses which are applied to the edge portion of the opening portion in the related art will now be described with reference to FIG. 5. In FIG. 5, reference numeral 103 denotes the contact layer of the semiconductor thin film 100; 30 the SiN inter-layer insulating film; 31A a contact electrode; and 16 the n-type side wiring. The edge portion forming the opening portion 12 of the inter-layer insulating film 30 is formed by a plane which perpendicularly crosses the flat surface of the contact layer 103.

A bonding energy Eb adapted to bond the semiconductor thin films (epitaxial films) 100 and the underground can be approximately estimated as follows.

$$Eb=200\text{-}350\ \text{mJ/cm}^2$$

A stress $\sigma_{tot}$(SiN) of the SiN inter-layer insulating film 30 on the semiconductor thin film 100 can be shown by an intrinsic stress $\sigma_{int}$(SiN) and a thermal stress $\sigma_{th}$(SiN).

$$\sigma_{tot}(\text{SiN})=\sigma_{int}(\text{SiN})+\sigma_{th}(\text{SiN})$$

$\sigma_{int}$(SiN) and $\sigma_{th}$(SiN) can be set as follows.

$$\sigma_{int}(\text{SiN})=3\times10^{9}\ [\text{dyn/cm}^2]$$

$$\sigma_{th}(\text{SiN})=[E/(1-\nu)]\times(\sigma_{EF}-(\sigma_{SIN})\times\delta T$$

where, $[E/(1-v)]$: elastic constant of SiN $\sigma_{EF}$: coefficient of thermal expansion of the semiconductor thin film $\sigma_{SIN}$: coefficient of thermal expansion of the SiN inter-layer insulating film δT: temperature difference $$[E/(1-\nu)]=34\times10^{12}\ [\text{dyn/cm}^2]$$

$$\sigma_{EF}=6\times10^{-6}\ [K^{-1}]$$

$$\sigma_{SIN}=2.5\times10^{-6}\ [K^{-1}]$$

Therefore, now assuming that a film forming temperature of the SiN film is equal to about 300° C. and δT=275 [K], the thermal stress $\sigma_{th}$(SiN) is approximately equal to $$\sigma_{th}(\text{SiN})=3.2\times10^{10}\ [\text{dyn/cm}^2]$$

Therefore, the stress of the SiN film is approximately equal to $$\sigma_{tot}(\text{SiN})=3.5\times10^{10}\ [\text{dyn/cm}^2]$$

When a film stress is represented by a value of Au and is estimated with respect to the contact electrode, in [E/(1−v)], a Young's modulus E and a Poisson's ratio v are equal to $$E=7.8\times10^{11}\ [\text{dyn/cm}^2]$$

$$v=0.44$$

Therefore, $$[E/(1-\nu)]=1.4\times10^{12}\ [\text{dyn/cm}^2]$$

When a coefficient of thermal expansion $\sigma_{metal}$ of the electrode is approximately set by the value of Au, $$\sigma_{metal}=1.4\times10^{-5}\ [K^{-1}]$$

When a largest temperature difference in the manufacturing process is assumed to be δT and a temperature lies within a range from δT to 490° C., the thermal stress of the electrode is obtained by $$\begin{aligned}\sigma_{th}(\text{metal}) &= 1.4\times10^{12}\times(14\times10^{-6}-6\times10^{-6})\times465\\ &= 5.2\times10^{9}\ [\text{dyn/cm}^2]\end{aligned}$$

The intrinsic stress $\sigma_{int}$ of the metal is approximately equal to $$\sigma_{int}=5\times10^{9}\ [\text{dyn/cm}^2]$$

Therefore, with respect to the contact electrode 31A, a film stress $\sigma_{tot}$(metal) is obtained by $$\begin{aligned}\sigma_{tot}(\text{metal}) &= \sigma_{int}+\sigma_{th}\\ &= 1\times10^{10}\ [\text{dyn/cm}^2]\end{aligned}$$

Therefore, a total stress $\sigma_{tot}$ which is applied to the semiconductor thin film 100 from the contact electrode 31A and the inter-layer insulating film 30 is obtained by $$\begin{aligned}\sigma_{tot} &\equiv \sigma_{tot}(SiN)+\sigma_{tot}(\text{metal})\\ &= 3.2\times10^{10}+1\times10^{10}\ [\text{dyn/cm}^2]\\ &= 4.2\times10^{10}\ [\text{dyn/cm}^2]\end{aligned}$$

Therefore, as a force adapted to allow a bonding boundary to be away by 1X, when a force $P_{ef}$ adapted to peel off the semiconductor thin film from the underground is schematically calculated from the bonding energy Eb, it is equal to $$P_{ef}\sim 3.5\times 10^{10}\ [\text{dyn/cm}^2]$$

That is, there is such a tendency that the total stress $\sigma_{tot}$ which is applied to the semiconductor thin film 100 from the contact electrode 31A and the inter-layer insulating film 30 is larger than $P_{ef}$.

Referring again to FIG. 5, the contact electrode 31A reacts to the semiconductor thin film 100 (contact layer 103) and is fixed thereto so as to have the strong adhesion. If the inter-layer insulating film 30 has also been formed by a chemical evaporation deposition, it is also similarly fixed to the semiconductor thin film 100 so as to have the strong adhesion.

According to the peel-off experiments by the inventors et al., it has been confirmed that the peel-off occurs only between the semiconductor thin film 100 and the substrate 10 as an underground. Thus, it will be understood that the adhesion between the semiconductor thin film 100 and the substrate 10 is smaller than the adhesion between the contact electrode 31A and the semiconductor thin film 100 and the adhesion between the inter-layer insulating film 30 and the semiconductor thin film 100.

If the contact electrode 31A is made of AuGeNi or AuGeNi/Au, the adhesion between the contact electrode 31A and the inter-layer insulating film 30 is smaller than the adhesion between the contact electrode 31A and the semiconductor thin film 100.

Figure 6:
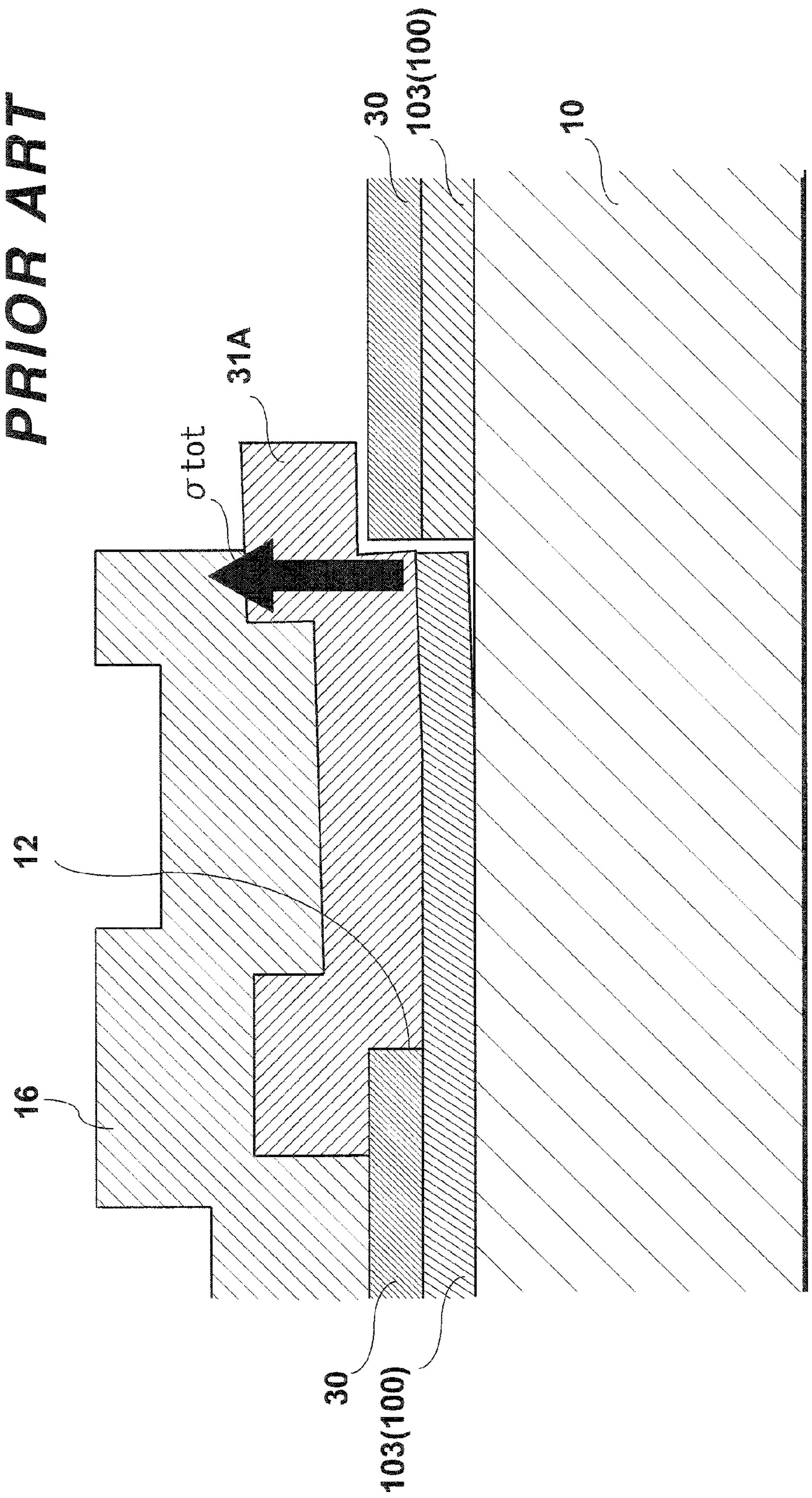
FIG. 6 is a cross sectional view showing a relation between the stresses and a peel-off in the conventional semiconductor device.

If the edge portion of the opening portion 12 of the inter-layer insulating film 30 is formed by the orthogonally-crossing surface as shown in FIG. 5, stresses σ from the contact electrode 31A and the inter-layer insulating film 30 are concentrated on the orthogonally-crossing surface. Therefore, the stress $\sigma_{tot}$ is concentratedly applied to the semiconductor thin film 100 in such a direction that it is peeled off from the substrate 10. There is a case where the semiconductor thin film 100 is broken and peeled off from the substrate 10 and the contact electrode 31A is peeled off from the inter-layer insulating film 30 as shown in FIG. 6.

On the other hand, if the inclined surface 32 having the angle of θ is provided for the edge portion forming the opening portion 12 of the inter-layer insulating film 30, the stresses σ are reduced due to the reduction of the thickness of the inclined surface 32. Thus, a small peeling-off force (stress) $\sigma_m$ is merely applied to the semiconductor thin film 100, its breakdown or the like can be prevented.

An angle of inclination θ is obtained. That is, when a force which acts in the direction in which the semiconductor thin film 100 is peeled off is assumed to be $P_{ef}(\theta)$, $$P_{ef}(\theta)=\sigma_{tot}\times\sin\theta$$

When a critical force adapted to allow the semiconductor thin film 100 to be peeled off is assumed to be $P_{ef}(c)$, $$P_{ef}(c)=3.5\times 10^{10}\ [\text{dyn/cm}^2]$$

From the above calculation, $$\sigma_{tot}=4.2\times 10^{10}\ [\text{dyn/cm}^2]$$

Therefore, a range of θ of $P_{ef}(\theta)\leqq P_{ef}(c)$ is $$\theta\leqq\sin^{-1}(3.5/4.2)=56^\circ$$

From the above calculation results, it is preferable to set the angle θ of the inclined surface 32 to be equal to or less than 56°.

Figure 7:
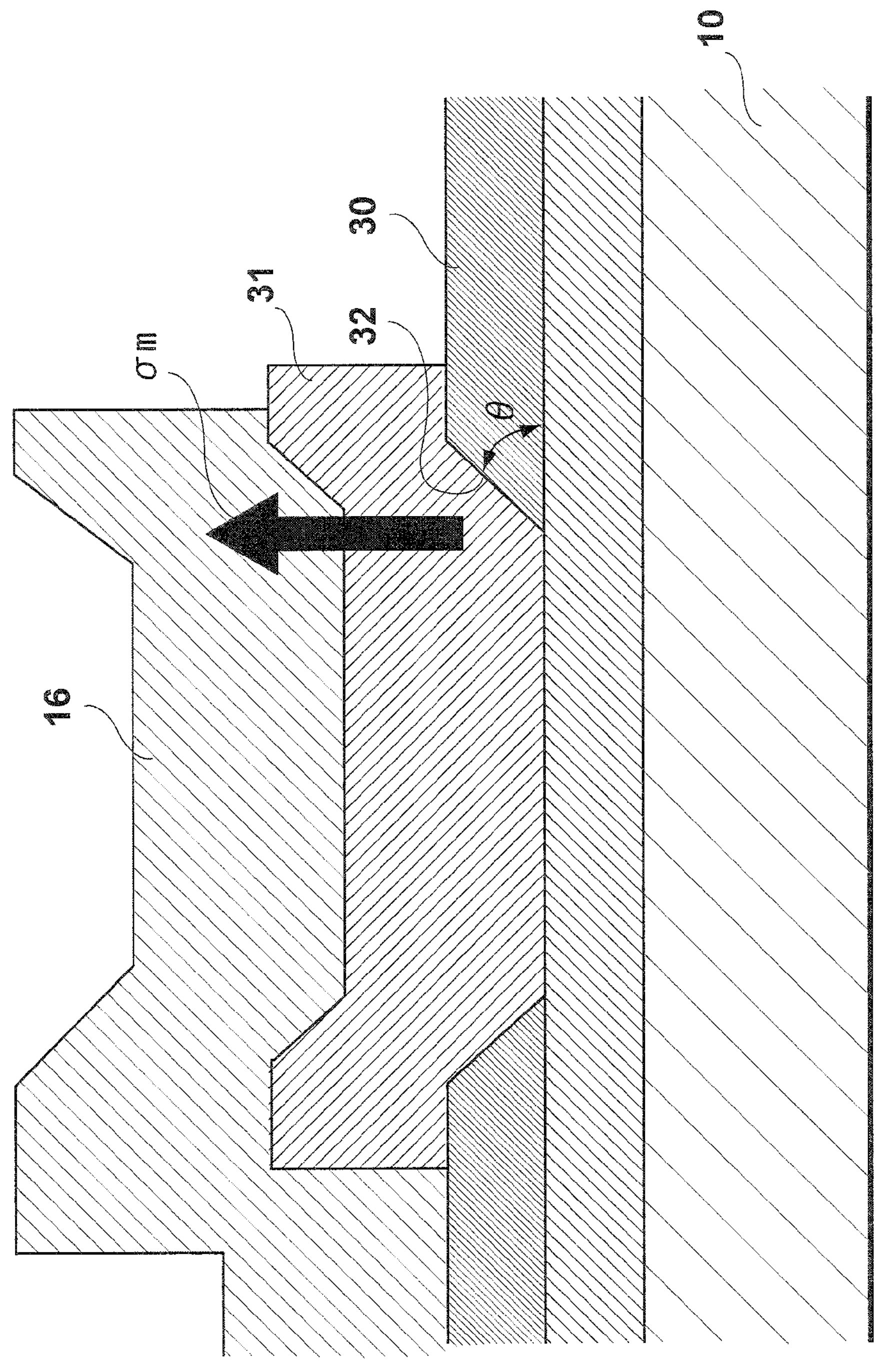
FIG. 7 is a schematic cross sectional view for explaining stresses which are applied to the semiconductor device according to the invention.
Figure 8:
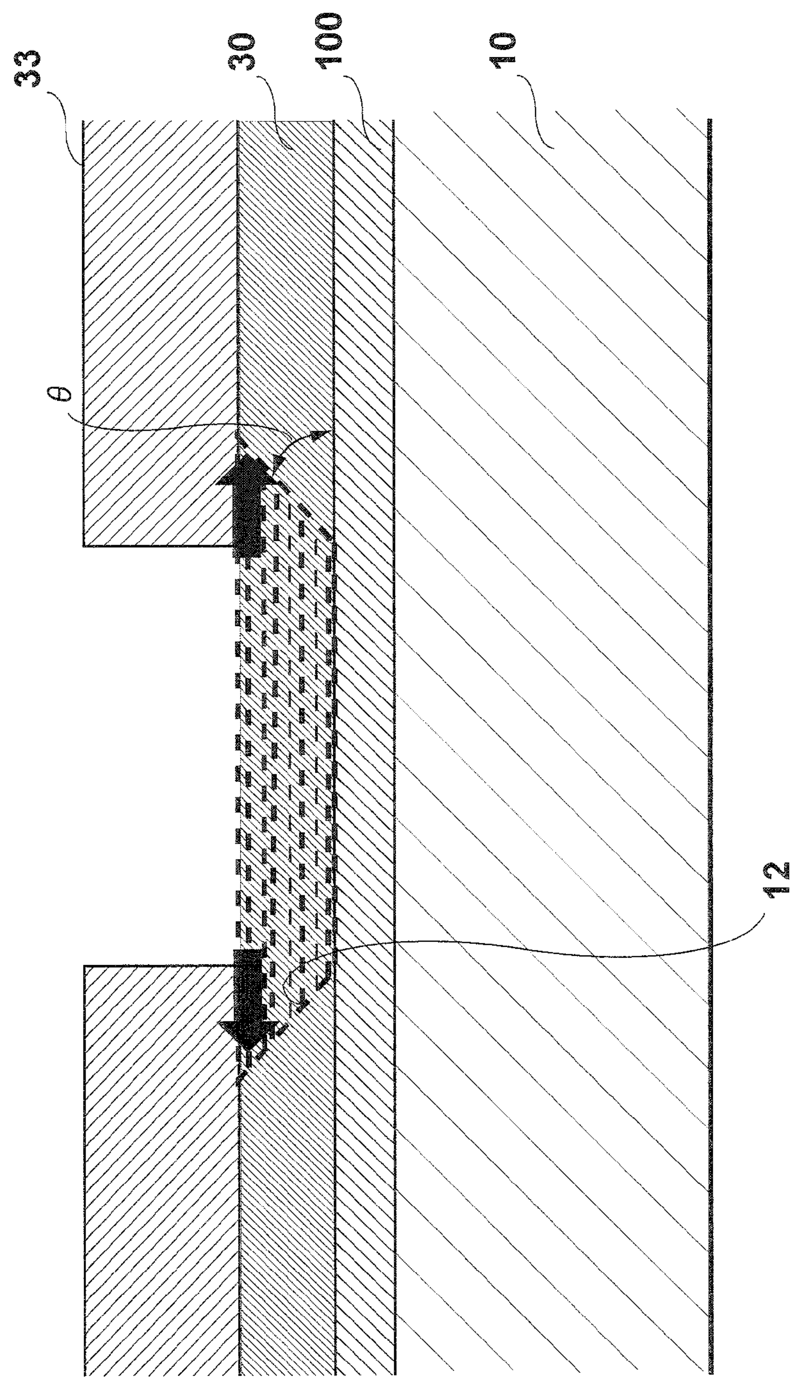
FIG. 8 is a cross sectional view for explaining an etching step of an inter-layer insulating film in the semiconductor device according to the invention.

A forming method of the inclined surface 32 in the opening portion 12 of the SiN inter-layer insulating film 30 shown in FIG. 7 will now be described. That is, as shown in FIG. 8, the SiN inter-layer insulating film 30 is formed on the semiconductor thin film 100 and a resist mask 33 is provided on the film 30 in order to form the opening portion in the inter-layer insulating film 30.

Subsequently, an isotropic etching process is executed by using a buffered HF for wet etching as an etchant, thereby forming the opening portion 12 having the inclined surface 32 of θ=about 45°. The inclination angle θ can be set by controlling the adhesion between the resist mask 33 and the inter-layer insulating film 30. In other words, if the adhesion between them is reduced by decreasing a baking temperature of the resist mask, since the etching in the lateral direction by the etchant is promoted, the inclination angle θ can be set to a small value.

In the embodiment, another semiconductor device such as a laser diode or the like can be provided for the semiconductor thin film 100 or the semiconductor device may be formed by selectively diffusing impurities into a portion other than a pn junction.

The inter-layer insulating film 30 can be also made of $SiO_2$, SiON, $Al_2O_3$, or AlN.

[Modification 1]

Figure 9:
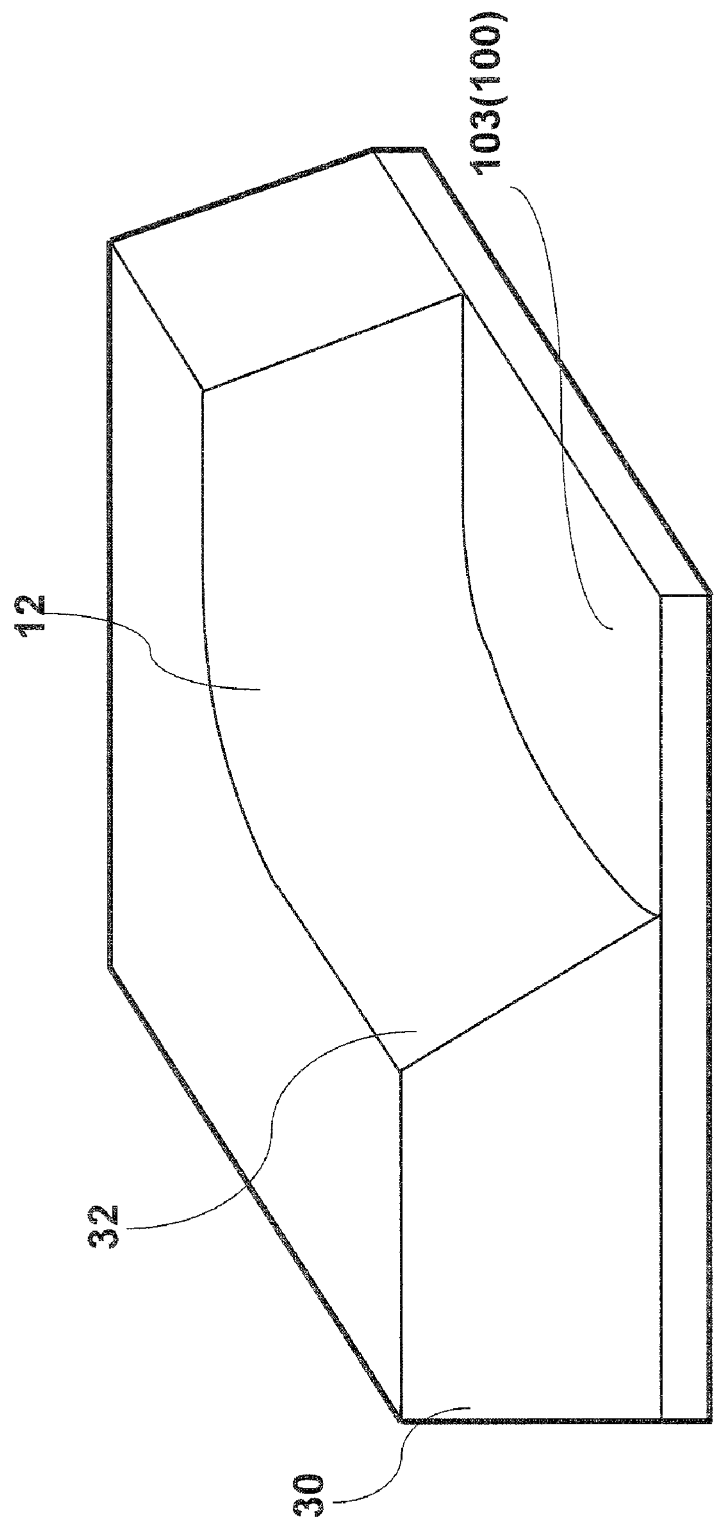
FIG. 9 is a perspective view of a main portion showing a modification of the embodiment 1 of the invention.

In a modification shown in FIG. 9, each of the four corners in the opening portion 12 of the inter-layer insulating film 30 is formed in an arc-shape. Thus, since the stress concentration in the corner portion of the opening portion 12 can be prevented, the peel-off or the like of the semiconductor thin film 100 can be further certainly prevented. In this case, since the resist mask is provided in the corner portion so as to hold the arc shape, the etchant can be largely penetrated. Thus, a variation in pattern shapes can be reduced.

Embodiment 2

Figure 10:
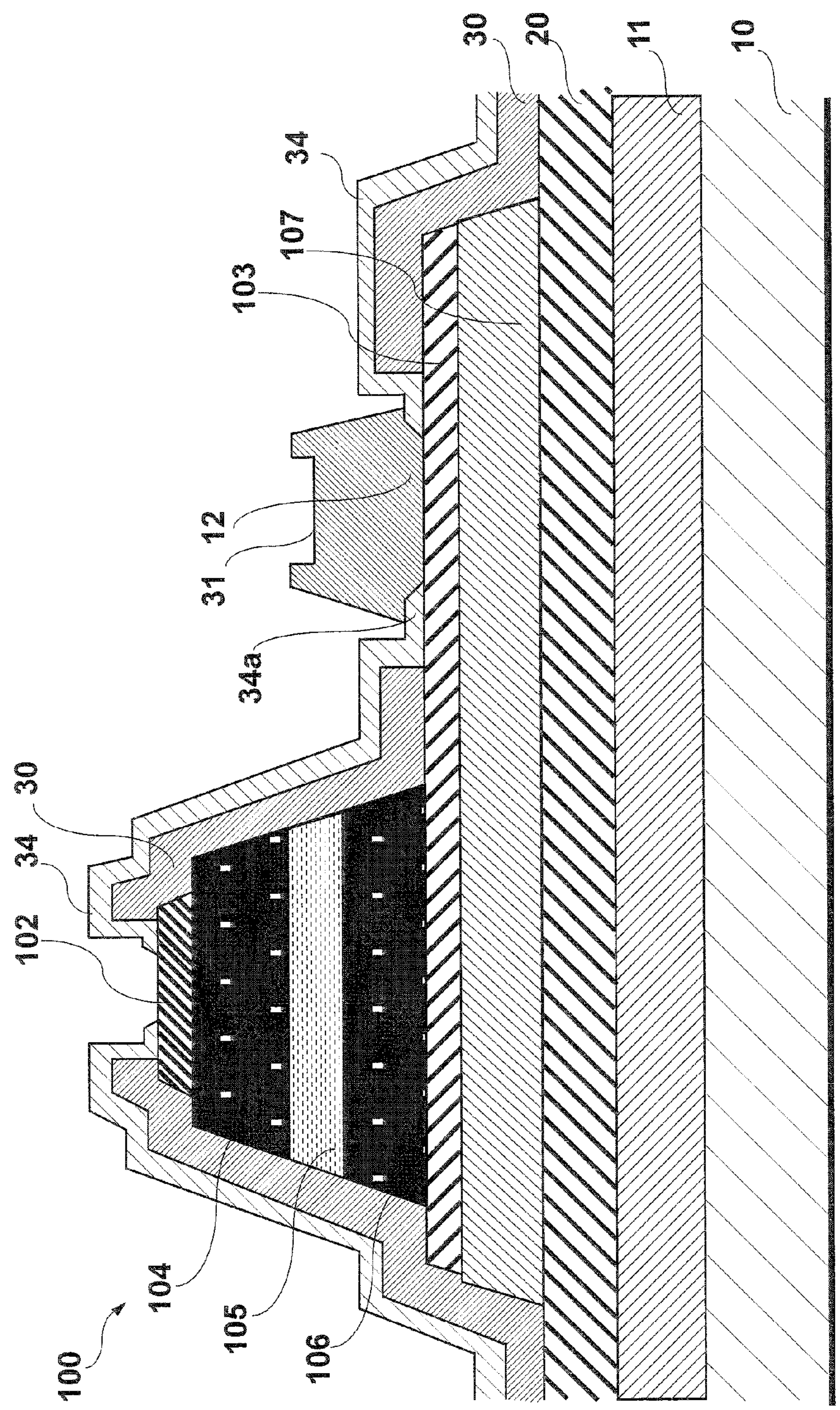
FIG. 10 is a cross sectional view schematically showing a semiconductor device according to an embodiment 2 of the invention.

In the embodiment, as shown in FIG. 10, an insulating film 34 is further formed on the inter-layer insulating film 30. The insulating film 34 is made by an SiN film so as to have a small thickness. At the position of the opening portion 12 of the inter-layer insulating film 30, an edge portion 34*a* which forms the opening of the insulating film 34 is extended to the inside of the opening portion 12 and a front edge is formed from the inclined surface. In FIG. 10, the same component elements as those in the embodiment 1 are designated by the same reference numerals and their description is omitted.

The thickness of inter-layer insulating film 30 is set to a value within a range from 100 to 300 nm. The thickness of insulating film 34 is set to a value within a range from 10 to 30 nm.

According to the embodiment, since the thin insulating film is formed and the inclined surface is provided for the edge portion 34*a* which forms the opening, the stress from the substrate side can be reduced by the edge portion 34*a*.

The insulating film 34 can be also made of a material such as $SiO_2$ or SiON different from that of the inter-layer insulating film 30. In this case, when the opening of the insulating film 34 is formed, even if a pin hole exists in the resist mask, the inter-layer insulating film 30 as a lower layer is not etched. Therefore, it is possible to effectively prevent a through-hole from being formed in the inter-layer insulating film.

The inclined surface 32 having the angle of θ (refer to FIG. 1) can be also formed in the edge portion which forms the opening portion 12 of the inter-layer insulating film 30.

[Modification 2]

Figure 11:
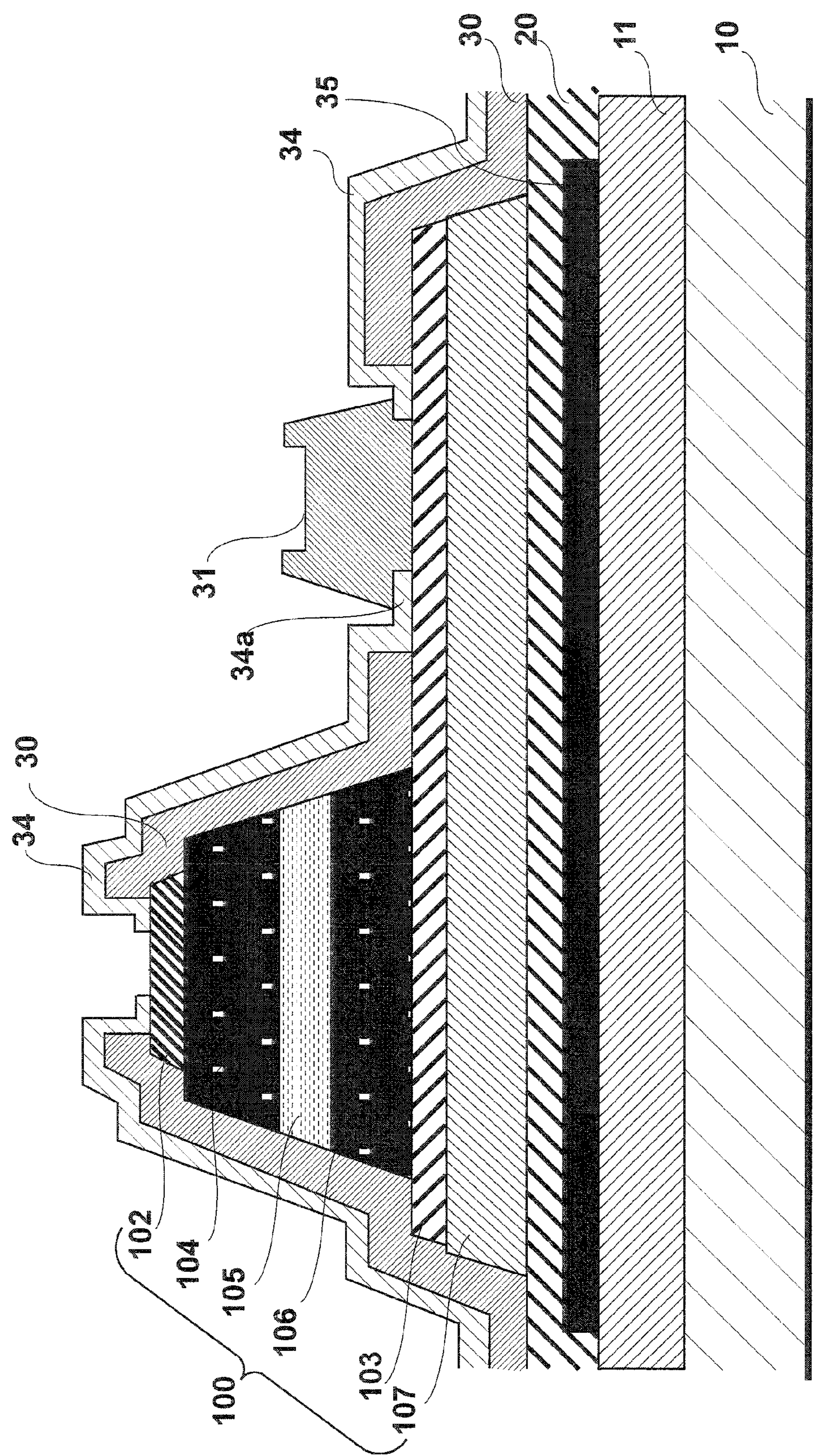
FIG. 11 is a cross sectional view schematically showing a modification of the embodiment 2 of the invention.

FIG. 11 shows a modification of the embodiment 2. In this modification, the edge portion 34*a* which forms the opening of the insulating film 34 is formed from the plane which merely perpendicularly crosses the flat surface of the contact layer 103. A reflecting layer 35 such as metal layer, multiple reflecting layer, or the like is provided at the position of the flat layer 20 of the substrate 10.

Even if the edge portion 34*a* of the insulating film 34 is formed by the orthogonally-crossing surface as shown in this modification, since the thickness of insulating film 34 is very small, the concentration of the stresses can be prevented by the whole edge portion 34*a*.

Embodiment 3

Figure 12:
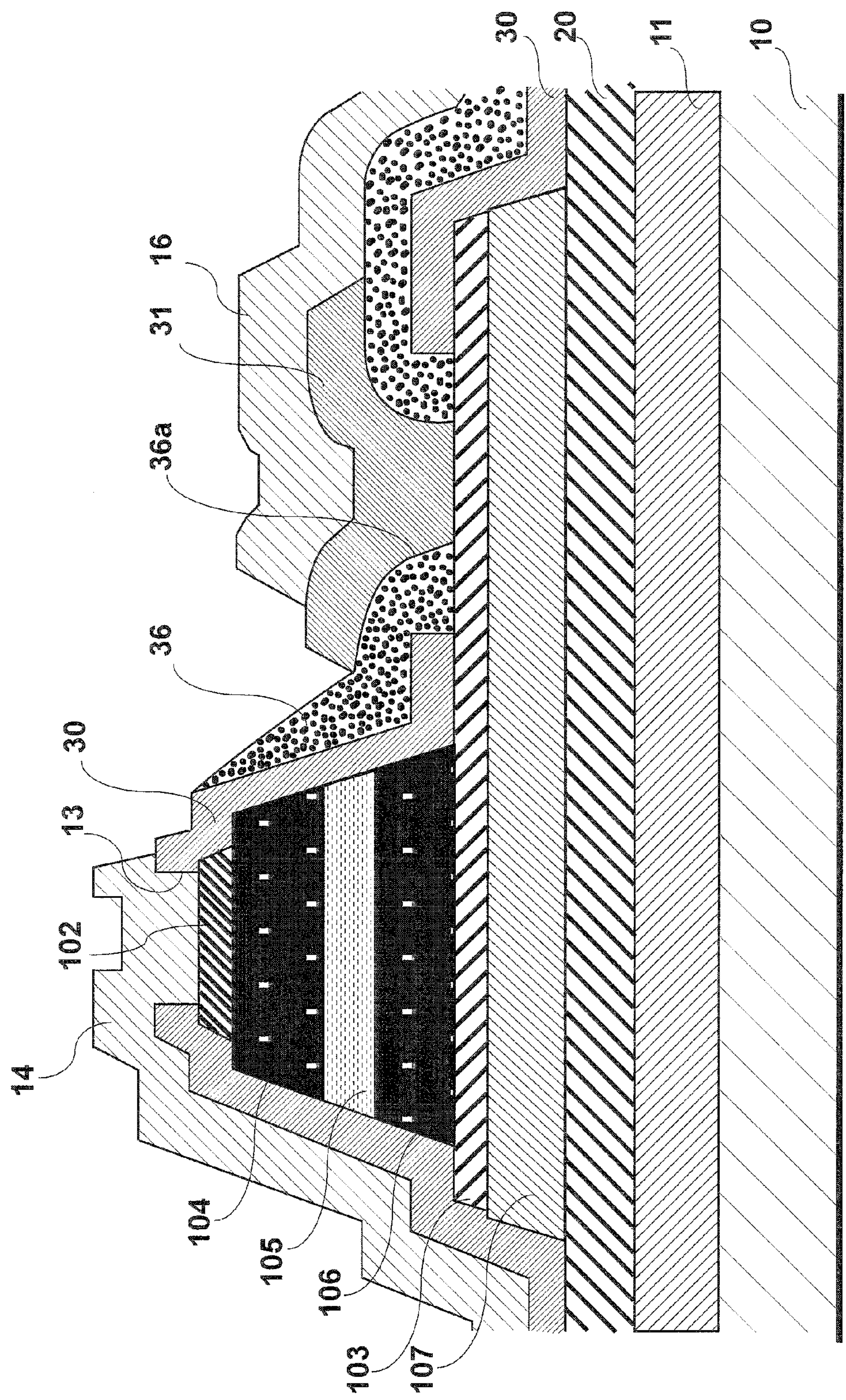
FIG. 12 is a cross sectional view schematically showing a semiconductor device according to an embodiment 3 of the invention.

In this embodiment, as shown in FIG. 12, a coating film 36 is provided on the side of the opening portion 12 of the inter-layer insulating film 30. The coating film 36 is made of an organic material such as SOG, polyimide, or the like and has a thickness of 0.5 to 1 μm. An edge portion 36*a* extending to the opening portion 12 of the coating film 36 has a curved shape. In FIG. 12, the same component elements as those in the embodiment 1 are designated by the same reference numerals and their description is omitted.

According to the embodiment 3, the stress from the substrate 10 side can be similarly reduced by the edge portion 36*a* having the curved shape of the coating film 36.

The coating film 36 can be formed on the whole surface of the inter-layer insulating film 30. In this case, a damage or the like of the semiconductor thin film is prevented and the semiconductor thin film can be protected.

The coating film 36 can be also formed by an inorganic material using, for example, SOG (spin on glass).

Embodiment 4

Figure 13:
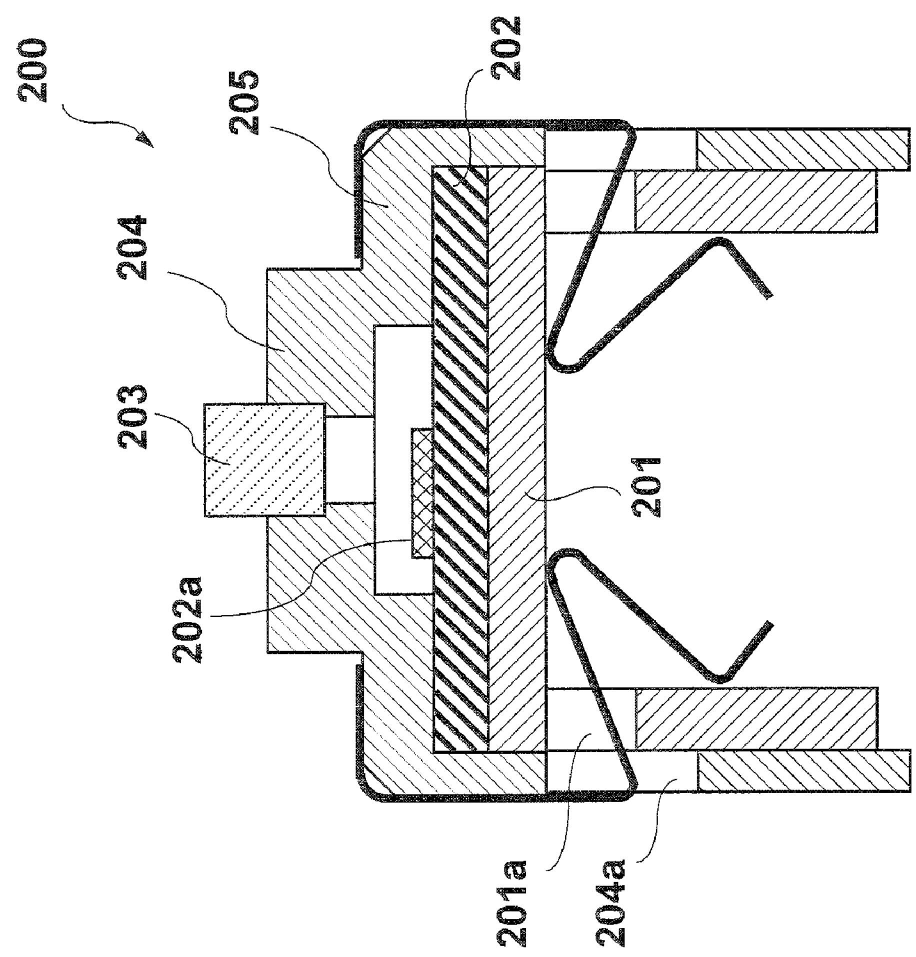
FIG. 13 is a cross sectional view of an LED print head according to the invention.

FIG. 13 is a diagram showing an LED print head 200 based on an LED printhead according to the invention.

Figure 14:
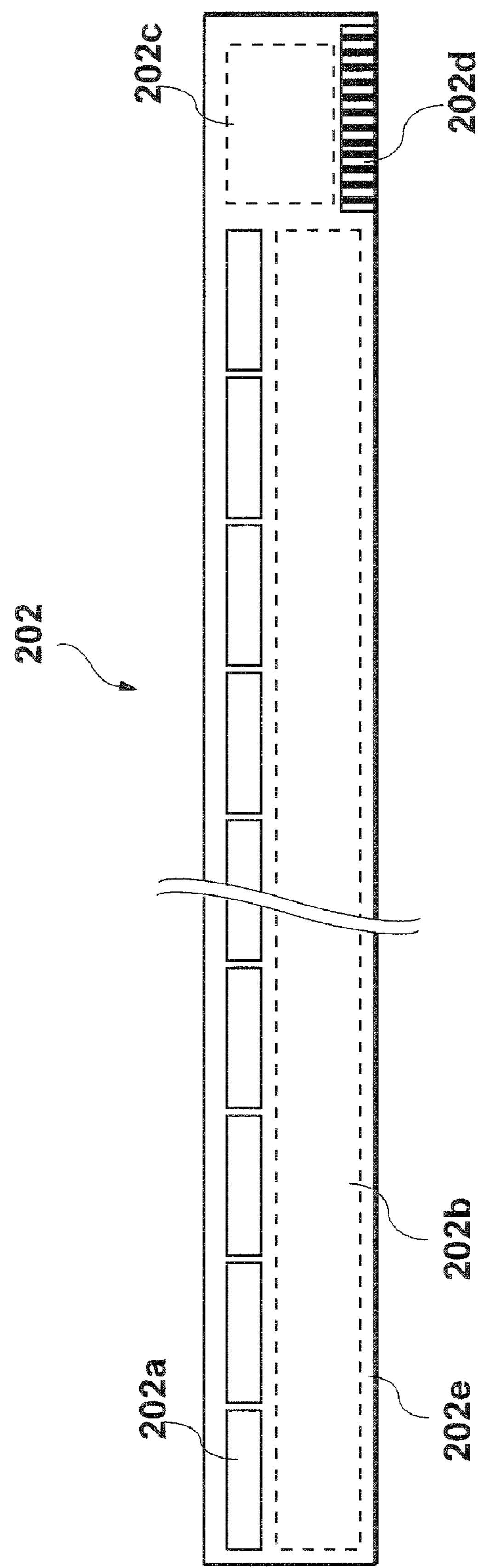
FIG. 14 is a plan view showing a layout of the LED print head of FIG. 13.

As shown in the diagram, an LED unit 202 has been mounted on a base member 201. The LED unit 202 is constructed by mounting the semiconductor device of one of the embodiments 1 to 3 onto a mounting board. FIG. 14 is a plan view showing a layout of a constructional example of the LED unit 202. A plurality of semiconductor devices constructed by assembling the light emitting portion and the driving portion and described in each of the foregoing embodiments are arranged as light emitting portion units 202*a* in the longitudinal direction. Further, electronic part mounting areas 202*b* and 202*c* on which electronic parts have been arranged and wirings have been formed, a connector 202*d* for supplying a control signal, a power source, and the like from the outside, and the like are provided on a mounting board 202*e*.

A rod lens array 203 as an optical element for converging the light emitted from the light emitting portion is arranged over the light emitting portion of the light emitting portion unit 202*a*. The rod lens array 203 is constructed by arranging a number of columnar optical lenses along the rectilinearly-arranged light emitting portions of the light emitting portion units 202*a*. The rod lens array 203 is held at a predetermined position by a lens holder 204 corresponding to an optical element holder.

As shown in the diagram, the lens holder 204 is formed so as to cover the base member 201 and the LED unit 202. The base member 201, LED unit 202, and lens holder 204 are integratedly sandwiched by a damper 205 which is arranged through opening portions 201*a* and 204*a* formed in the base member 201 and the lens holder 204. Therefore, the light emitted from the LED unit 202 passes through the rod lens array 203 and is irradiated to a predetermined external member. The LED print head 200 is used as an exposing apparatus of, for example, an electrophotographic printer, an electrophotographic copying apparatus, or the like.

As mentioned above, according to the LED printhead of the embodiment, since one of the semiconductor devices shown in the embodiments 1 to 3 is used as an LED unit 202, the LED printhead of high quality and high reliability can be provided.

Embodiment 5

Figure 15:
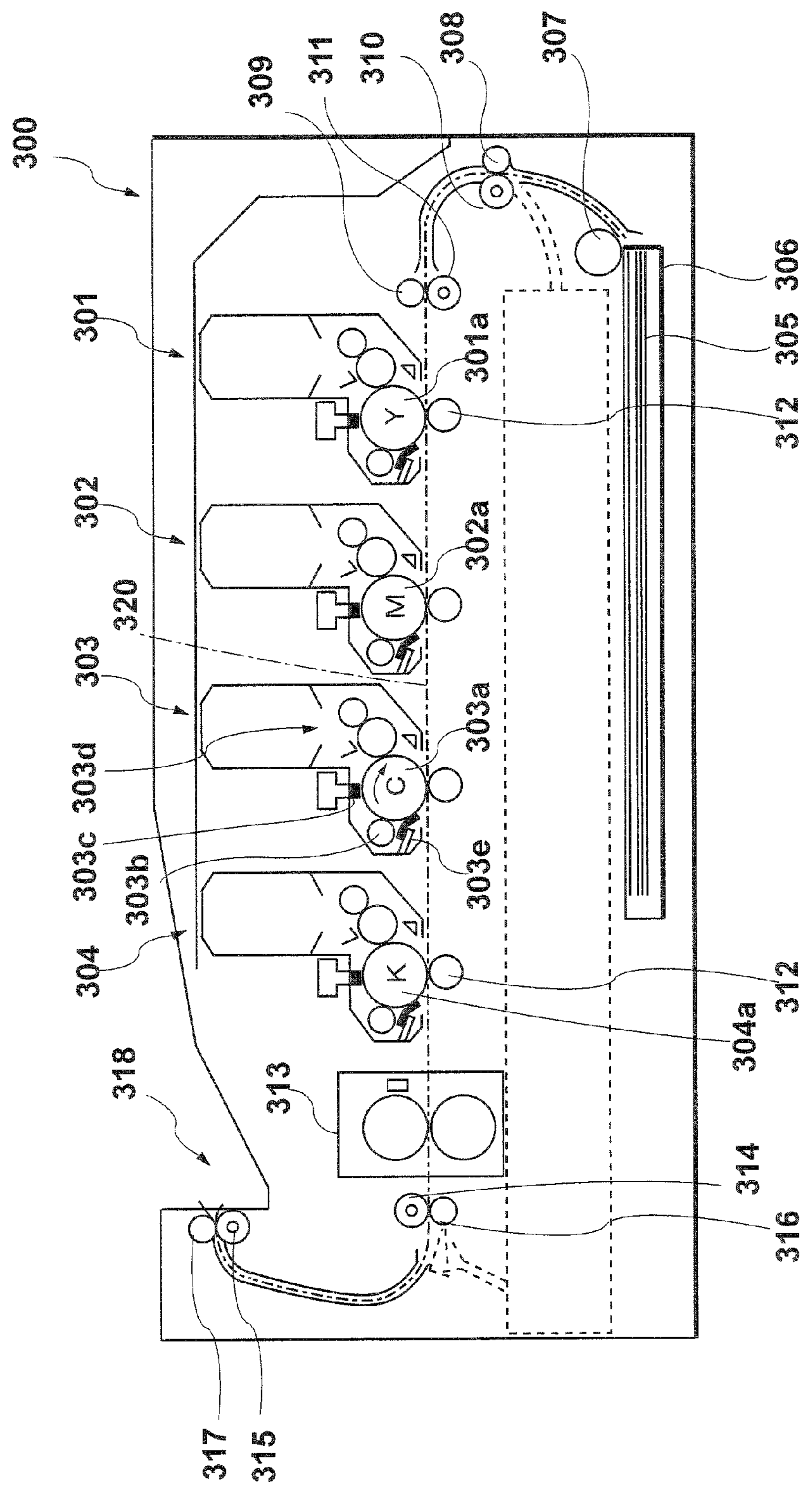
FIG. 15 is a whole constructional diagram of an image forming apparatus according to the invention.

FIG. 15 is a main section constructional diagram schematically showing a main section construction of an image forming apparatus 300 according to the invention.

As shown in the diagram, four processing units 301 to 304 for forming images of yellow, magenta, cyan, and black colors are arranged in the image forming apparatus 300 along a conveying path 320 of a record medium 305 in order from the upstream side. Since internal constructions of the processing units 301 to 304 are common, the internal constructions will be described with respect to the processing unit 303 of cyan as an example.

A photosensitive drum 303*a* as an image holding body is arranged in the processing unit 303 so as to be rotatable in the direction shown by an arrow. A charging device 303*b* and an exposing device 303*c* are arranged around the photosensitive drum 303*a* in order from the upstream side in the rotating direction. The charging device 303*b* supplies an electricity to the surface of the photosensitive drum 303*a*, thereby charging it. The exposing device 303*c* selectively irradiates the light onto the surface of the photosensitive drum 303*a*, thereby forming an electrostatic latent image. Further, a developing device 303*d* and a cleaning device 303*e* are arranged. The developing device 303*d* deposits toner of a predetermined color (cyan) onto the surface of the photosensitive drum 303*a* on which the electrostatic latent image has been formed, thereby generating a developed image. The cleaning device 303*e* removes the toner remaining on the surface of the photosensitive drum 303*a*. A drum or a roller which is used in each of those devices is rotated by a driving source (not shown) and gears (not shown).

A sheet cassette 306 for enclosing the record media 305 such as paper or the like in the stacked state is attached in a lower portion of the image forming apparatus 300. A hopping roller 307 for separating and conveying the record media 305 one by one is arranged over the sheet cassette 306. Further, registration rollers 310 and 311 are arranged on the downstream side of the hopping roller 307 in the conveying direction of the record media 305. The registration rollers 310 and 311 sandwich the record medium 305 together with pinch rollers 308 and 309, thereby correcting an oblique motion of the record medium 305 and conveying the record medium to the processing units 301 to 304. The hopping roller 307 and the registration rollers 310 and 311 are rotated in an interlocking relational manner by the driving source (not shown) and gears (not shown).

A transfer roller 312 made of a semiconductive rubber or the like is arranged at a position where it faces the photosensitive drum of each of the processing units 301 to 304. To deposit the toner on the surface of each of the photosensitive drums 301*a* to 304*a* onto the record medium 305, the image forming apparatus 300 is constructed so as to cause a predetermined electric potential difference between the surface of each of the photosensitive drums 301*a* to 304*a* and the surface of each of the transfer rollers 312.

A fixing apparatus 313 has a heating roller and a backup roller and presses and heats the toner transferred onto the record medium 305, thereby fixing it. Ejecting rollers 314 and 315 sandwich the record medium 305 ejected from the fixing apparatus 313 together with pinch rollers 316 and 317 in the ejecting section and conveys the medium to a record medium stacker section 318. The ejecting rollers 314 and 315 are rotated in an interlocking relational manner by the driving source (not shown) and gears (not shown). As an exposing device 303*c* used here, the LED print head 200 described in the embodiment 4 is used.

The operation of the image forming apparatus with the above construction will now be described.

First, the record media 305 enclosed in the sheet cassette 306 in the stacked state are separated and conveyed one by one from the top sheet by the hopping roller 307. Subsequently, the record medium 305 is sandwiched between the registration roller 310 and the pinch roller 308 and between the registration roller 311 and the pinch roller 309 and conveyed to the photosensitive drum 301*a* of the processing unit 301 and the transfer roller 312. After that, the record medium 305 is sandwiched between the photosensitive drum 301*a* and the transfer roller 312. When the toner image is transferred onto the record image surface, the record medium 305 is conveyed by the rotation of the photosensitive drum 301*a* simultaneously with it.

Similarly, the record medium 305 sequentially passes through the processing units 302 to 304. During the passage, the electrostatic latent images formed by exposing devices 301*c* to 304*c* are developed to toner images of the respective colors by developing devices 301*d* to 304*d*, and the toner images are sequentially transferred and overlaid onto the record surface. After the toner images of the respective colors were overlaid onto the record surface, the toner images are fixed onto the record medium 305 by the fixing apparatus 313. Subsequently, the record medium 305 is sandwiched between the ejecting roller 314 and the pinch roller 316 and between the ejecting roller 315 and the pinch roller 317 and ejected to the external record medium stacker section 318 of the image forming apparatus 300. By the above processing steps, a color image is formed onto the record medium 305.

As mentioned above, according to the image forming apparatus of the embodiment, since the LED print head described in the foregoing embodiment 4 is used, the image forming apparatus of high quality and high reliability can be provided.

Although the foregoing embodiments 1 to 3 have been described with respect to the example in which the light emitting diode (LED) has been formed as a semiconductor element formed on the semiconductor thin film of the semiconductor device, the invention is not limited to such an example. Other various modifications are possible. For example, a photosensitive element is formed in place of the light emitting element or not only such a optical element but also another semiconductor element may be formed, and the like.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light emitting device comprising:

a substrate;

a semiconductor thin film is fixed onto the substrate, and having a semiconductor light emitting element formed therein, the semiconductor thin film further including:

a conductive layer formed on a surface of the substrate, a first contact layer working as a lower electrode of the semiconductor light emitting element, and a second contact layer working as an upper electrode of the semiconductor light emitting element, and;

an inter-layer insulating film which is provided on said semiconductor thin film;

an opening portion which is formed in said inter-layer insulating film at a position where the upper electrode that is electrically connected to said semiconductor light emitting element is provided; and a stress absorbing portion, which absorbs a stress that is applied from said substrate, provided along an edge portion of said opening portion.

2. The semiconductor light emitting device according to claim 1, wherein each corner portion of said stress absorbing portion is formed in an arc shape.

3. The semiconductor light emitting device according to claim 1, wherein said inter-layer insulating film is made of one of or a combination of $SiO_2$, SiN, and SiON.

4. The semiconductor light emitting device according to claim 1, wherein said stress absorbing portion is formed by an inclined surface provided for the edge portion which forms said opening portion of said semiconductor thin film.

5. The semiconductor light emitting device according to claim 4, wherein each corner portion of said stress absorbing portion is formed in an arc shape.

6. The semiconductor light emitting device according to claim 4, wherein said inter-layer insulating film is made of one of or a combination of $SiO_2$, SiN, and SiON.

7. The semiconductor light emitting device according to claim 1, wherein said stress absorbing portion is formed by a thin extending portion which is a part of a thin insulating film formed on said inter-layer insulating film so as to have a thickness smaller than that of said inter-layer insulating film and which covers the edge portion of said opening portion and extends to the inside of said edge portion.

8. The semiconductor light emitting device according to claim 7, wherein each corner portion of said stress absorbing portion is formed in an arc shape.

9. The semiconductor light emitting device according to claim 7, wherein said inter-layer insulating film is made of one of or a combination of $SiO_2$, SiN, and SiON.

10. The semiconductor light emitting device according to claim 1, wherein said stress absorbing portion is formed by a coating film which covers at least the edge portion of said opening portion of said inter-layer insulating film and extends to the inside of said edge portion.

11. The semiconductor light emitting device according to claim 10, wherein said coating film is composed of organic materials.

12. The semiconductor light emitting device according to claim 10, wherein each corner portion of said stress absorbing portion is formed in an arc shape.

13. The semiconductor light emitting device according to claim 10, wherein said inter-layer insulating film is made of one of or a combination of $SiO_2$, SiN, and SiON.

14. The semiconductor light emitting device according to claim 1, wherein said semiconductor thin film is composed of single crystal semiconductor.

15. An LED (Light Emitting Diode) printhead, comprising:

a semiconductor light emitting device;

a supporting body which supports said semiconductor light emitting device; and a lens array which converges light emitted from each of said LEDs semiconductor light emitting device, wherein said semiconductor light emitting device includes:

a substrate;

a semiconductor thin film fixed onto the substrate, and having a semiconductor light emitting element formed therein, the semiconductor thin film further including:

a conductive layer formed on a surface of the substrate, a first contact layer working as a lower electrode of the semiconductor light emitting element, and a second contact layer working as an upper electrode of the semiconductor light emitting element, and;

an inter-layer insulating film which is provided on said semiconductor thin film;

an opening portion which is formed in said inter-layer insulating film at a position where the upper electrode that is electrically connected to said semiconductor light emitting element is provided; and a stress absorbing portion, which absorbs a stress that is applied from said substrate, provided along an edge portion of said opening portion, and wherein said semiconductor light emitting element is a LED.

16. An image forming apparatus, comprising:

a LED (Light Emitting Diode) printhead;

a photosensitive body which is exposed by light emitted from said LED printhead and on which an electrostatic latent image is formed; and a developing unit which develops said electrostatic latent image, wherein said LED printhead includes:

a semiconductor light emitting device;

a supporting body which supports said semiconductor light emitting device; and a lens array which converges light emitted from said semiconductor light emitting device, wherein said semiconductor light emitting device has:

a substrate;

a semiconductor thin film fixed onto the substrate, and having a semiconductor light emitting element formed therein, the semiconductor thin film further including:

a conductive layer formed on a surface of the substrate, a first contact layer working as a lower electrode of the semiconductor light emitting element, and a second contact layer working as an upper electrode of the semiconductor light emitting element, and;

an inter-layer insulating film which is provided on said semiconductor thin film;

an opening portion which is formed in said inter-layer insulating film at a position where the upper electrode that is electrically connected to said semiconductor light emitting element is provided; and a stress absorbing portion, which absorbs a stress that is applied from said substrate, provided along an edge portion of said opening portion, wherein said semiconductor light emitting element is a LED.

17. The semiconductor light emitting device of claim 1, wherein the substrate is formed of a first semiconductor material, and the semiconductor thin film has a epitaxial structure formed from semiconductor materials different from the first semiconductor material.

18. The semiconductor light emitting device of claim 1, wherein the substrate has a driving circuit formed thereon, and the semiconductor light emitting element has a layered insular structure and is driven by the driving circuit.

* * * * *